(12) United States Patent
Kim et al.

(10) Patent No.: US 7,538,375 B2
(45) Date of Patent: May 26, 2009

(54) CAPACITOR STRUCTURE OF SEMICONDUCTOR DEVICE AND METHOD OF FABRICATING THE SAME

(75) Inventors: Yoon-Hae Kim, Seongnam-si (KR); Seung-Koo Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 67 days.

(21) Appl. No.: 11/730,810

(22) Filed: Apr. 4, 2007

(65) Prior Publication Data
US 2007/0235790 A1 Oct. 11, 2007

(30) Foreign Application Priority Data
Apr. 5, 2006 (KR) .................. 10-2006-0031079

(51) Int. Cl.
*H01L 27/108* (2006.01)
(52) U.S. Cl. ............... 257/306; 257/303; 257/E27.086
(58) Field of Classification Search .......... 257/306, 257/E27.086
See application file for complete search history.

(56) References Cited

U.S. PATENT DOCUMENTS

| | | | |
|---|---|---|---|
| 5,525,546 A * | 6/1996 | Harada et al. ............ 438/612 |
| 6,765,255 B2 | 7/2004 | Jin et al. | |
| 6,794,262 B2 | 9/2004 | Ning et al. | |
| 7,273,760 B2 | 9/2007 | Takaya | |
| 2004/0089894 A1* | 5/2004 | Sashida ............ 257/306 |
| 2006/0076600 A1* | 4/2006 | Nakabayashi et al. ....... 257/298 |
| 2007/0170487 A1* | 7/2007 | Heitmann et al. .......... 257/308 |

FOREIGN PATENT DOCUMENTS

| | | |
|---|---|---|
| JP | 2005-116715 | 4/2005 |
| JP | 2005-191324 | 7/2005 |
| KR | 10-1998-0074221 A | 11/1998 |
| KR | 10-2002-0045190 A | 6/2002 |
| KR | 10-2003-0077284 | 10/2003 |
| KR | 10-2005-0028749 A | 3/2005 |
| KR | 10-2005-0055433 | 6/2005 |

* cited by examiner

*Primary Examiner*—Tu-Tu V Ho
(74) *Attorney, Agent, or Firm*—Lee & Morse, P.C.

(57) ABSTRACT

A semiconductor device having superior capacitance may include interconnections formed on a semiconductor substrate, an interlayer insulation layer on the interconnections and having vias exposing a portion of the top surface of the interconnections, a capacitor which may be on the interlayer insulation layer and having a bottom electrode, a dielectric layer pattern, and a top electrode which may be sequentially stacked, and a pad structure may be connected to the interconnections through the vias. The pad structure may include pads for bonding with external electronic devices and a first upper interconnection connected to the top electrode of the capacitor.

16 Claims, 13 Drawing Sheets

CAPACITOR STRUCTURE OF SEMICONDUCTOR DEVICE AND METHOD OF FABRICATING THE SAME

BACKGROUND OF THE INVENTION

1. Field of the Invention

The present invention relates to a semiconductor device and a method of fabricating the same. More particularly, the present invention relates to a capacitor structure spaced farthest from a semiconductor substrate and a method of fabricating the same.

2. Description of the Related Art

A semiconductor device may include active elements, e.g., a transistor, a diode, etc., and passive elements, e.g., a resistor, a capacitor, etc. The active elements and the passive elements may be combined to perform original functions of the semiconductor device.

A capacitor may be classified, according to its structure, as a metal-oxide-silicon (MOS) capacitor, a pn-junction capacitor, a polysilicon-insulator-polysilicon (PIP) capacitor, or a metal-insulator-metal (MIM) capacitor. The MOS capacitor, the pn-junction capacitor, and the PIP capacitor may use single crystal or polycrystalline silicon having a higher resistivity than metal as an electrode material in at least one side of the capacitor. The resistances of these capacitor electrodes may thus be relatively larger than that of a MIM capacitor. Additionally, when a voltage is applied to an electrode of the capacitor, a depletion region may be formed on the single crystal silicon or the polycrystalline silicon. Therefore, except for MIM capacitors, it may be difficult to maintain capacitance. As a result, when a high-speed and stable capacitance is required, the MIM capacitor may be widely used in semiconductor devices. For example, the MIM capacitor may be used as, e.g., an analog capacitor or a filter of a wire/wireless communication device, a decoupling capacitor of a main process unit board, a radio frequency (RF) capacitor of a high frequency circuit, etc.

Since most semiconductor capacitors are fabricated using a process for forming interconnection structure, they may be located between a bonding pad and a substrate in a vertical position. However, similar to a RF device, some semiconductor devices need a capacitor structure capable of minimizing the influence caused by a substrate noise, for stabilizing operational characteristics in the semiconductor device.

SUMMARY OF THE INVENTION

The present invention is therefore directed to a capacitor structure of a semiconductor device, which substantially overcomes one or more of the problems due to the limitations and disadvantages of the related art.

It is therefore a feature of an embodiment of the present invention to provide a method of fabricating a capacitor structure of a semiconductor device that may minimize the influence of substrate noise.

It is therefore another feature of an embodiment of the present invention to provide a MIM capacitor structure minimizing the influence of a substrate noise, and a method of manufacturing the MIM capacitor structure.

At least one of the above and other features and advantages of the present invention may be realized by providing a method of fabricating a capacitor structure of a semiconductor device, which may include forming an interlayer insulation layer which may be on a semiconductor substrate, forming a capacitor which may be on the interlayer insulation layer, the capacitor including a bottom electrode, a dielectric layer pattern, and a top electrode forming a pad metal layer on the interlayer insulation layer to cover the capacitor, and patterning the pad metal layer to form pads which may bond with external electronic devices and to form first and second upper interconnections connected to the top electrode and the bottom electrode, respectively.

Forming the capacitor may include forming a bottom electrode layer on the interlayer insulation layer, patterning the bottom electrode layer to form the bottom electrode, sequentially forming a dielectric layer and a top electrode layer which may be on the resulting structure having the bottom electrode, and patterning the dielectric layer and the top electrode layer to form the dielectric layer pattern and the top electrode which may be sequentially stacked, where the dielectric layer pattern and the top electrode may be formed to expose a portion of a top surface of the bottom electrode. The dielectric layer pattern and the top electrode may be formed to extend from the top surface of the bottom electrode to cover the top surface of the interlayer insulation layer in a region adjacent to the first upper interconnection, and the dielectric layer pattern and the top electrode may be patterned to expose the top surface of the bottom electrode in a region adjacent to the second upper interconnection, and the second upper interconnection may be connected to the top surface of the exposed bottom electrode. The method may further include, before forming the interlayer insulation layer, forming interconnections on the semiconductor substrate, and after the forming of the pads and the first and second upper interconnections, forming a protective layer pattern on the pads and the first and second upper interconnections, where the protective layer pattern may have openings exposing top surfaces of the pads, and bonding metal wires to the top surfaces of the pads that may be exposed through the openings. The height, thickness and material of the first and second upper interconnections may be substantially identical to those of the pads. The top surface and bottom electrodes of the capacitor may be formed to be electrically connected to the interconnections through the first and second upper interconnections, which may be connected to the top surfaces of the top and bottom electrodes, respectively. The protective layer pattern may be formed of at least one of a silicon oxide layer, a silicon nitride layer, or a polyimide layer, and may include at least one polyimide layer.

The method may further include patterning the interlayer insulation layer to form vias and at least one mold opening, where the vias may penetrate the interlayer insulation layer to expose the top surfaces of the interconnections, the mold opening penetrating the interlayer insulation layer, where the mold opening may be formed on a region where the capacitor may be formed, and the pad metal layer may be connected to the interconnections through the vias. The bottom electrode, the dielectric layer pattern, and the top electrode may be formed to expose the vias and the top surface of the interlayer insulation layer around the vias, and the bottom electrode, the dielectric layer pattern, and the top electrode may conform to and cover the mold opening. Forming the capacitor may include patterning the interlayer insulation layer to form vias exposing the top surfaces of the interconnections, where the pad metal layer may be connected to the interconnections through the vias. Patterning the metal layer may include forming the first upper interconnection and the second upper interconnection such that the first upper interconnection may cover the top surface of the top electrode of the capacitor and may be connected to one of the interconnections through at least one of the vias, and the second upper interconnection may be connected to the top surface of the bottom electrode of the capacitor and may be connected to another one of the interconnections through at least one of the vias.

At least one of the above and other features and advantages of the present invention may be realized by providing a method of fabricating a capacitor structure of a semiconductor device which may include forming interconnections on a semiconductor substrate, forming an interlayer insulation layer which may have a mold opening and vias which may expose a portion of a top surface of the interconnections, forming a capacitor on the mold opening and the interlayer insulation layer which may be around the mold opening, where the capacitor may have a bottom electrode, a dielectric layer pattern and a top electrode, forming a pad metal layer filling the vias, and patterning the pad metal layer to simultaneously form pads for bonding with external electronic devices and form an upper interconnection connected to a top electrode of the capacitor, where the bottom electrode may be connected to the interconnection below the bottom electrode through the mold opening.

The pad and the upper interconnection may be conductive structures which are located farthest from the semiconductor device among conductive structures constituting the semiconductor device, and the capacitor may be a conductive structure which is located farthest from the semiconductor device among conductive structures constituting the semiconductor device except for the pad and the upper interconnection.

At least one of the above and other features and advantages of the present invention may be realized by providing a semiconductor device which may include interconnections formed on a semiconductor substrate, an interlayer insulation layer on the interconnections and having vias which may expose a portion of the top surface of the interconnections, a capacitor on the interlayer insulation layer which may have a bottom electrode, a dielectric layer pattern, and a top, and a pad structure connected to the interconnections through the vias. The pad structure may include pads for bonding with external electronic devices and a first upper interconnection connected to the top electrode of the capacitor.

At least one of the above and other features and advantages of the present invention may be realized by providing a semiconductor device which may include interconnections on a semiconductor substrate, an interlayer insulation layer on the interconnections which may have vias exposing a portion of the top surface of the interconnections, a capacitor on the interlayer insulation layer which may have a bottom electrode, a dielectric layer pattern, and a top electrode, and a pad structure which may be connected to the interconnections through the vias. The pad structure may include pads for bonding with external electronic devices and a first upper interconnection connected to the top electrode of the capacitor.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2006-31079, filed on Apr. 5, 2006, in the Korean Intellectual Property Office, and entitled: "Capacitor Structure of Semiconductor Device and Method of Fabricating the Same," is incorporated by reference herein in its entirety.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawing figures, the dimensions of layers and regions are exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be also understood that, although the terms first, second, third, and the like may be used herein to describe various regions, layers, and the like, these regions and layers should not be limited by these terms. These terms are only used to distinguish one region and layer from another region and layer. Thus, a first region and layer mentioned in one embodiment could be termed a second region and layer in another embodiment without departing from the teachings of the present invention. Each embodiment described and illustrated herein may include its complementary embodiment as well.

FIGS. 1A through 1F illustrate sectional views of stages of a method of fabricating a semiconductor device according to an embodiment of the present invention. For convenience, the fabricating method of the present invention may be classified into a lower structure formation process and an upper structure formation process on the basis of a pad structure formation step. The lower structure formation process may include steps between a wafer fab-in step and a step for forming interconnections with the pad structure. The upper structure formation process may include stages between the step of forming the interconnection and the wafer fab-out step. The lower structure formation step may be performed based on a general method of fabricating a semiconductor device.

The upper structure formation stage of the present invention will be described hereinafter with reference to FIGS. 1A through 1F.

Figure 1A:
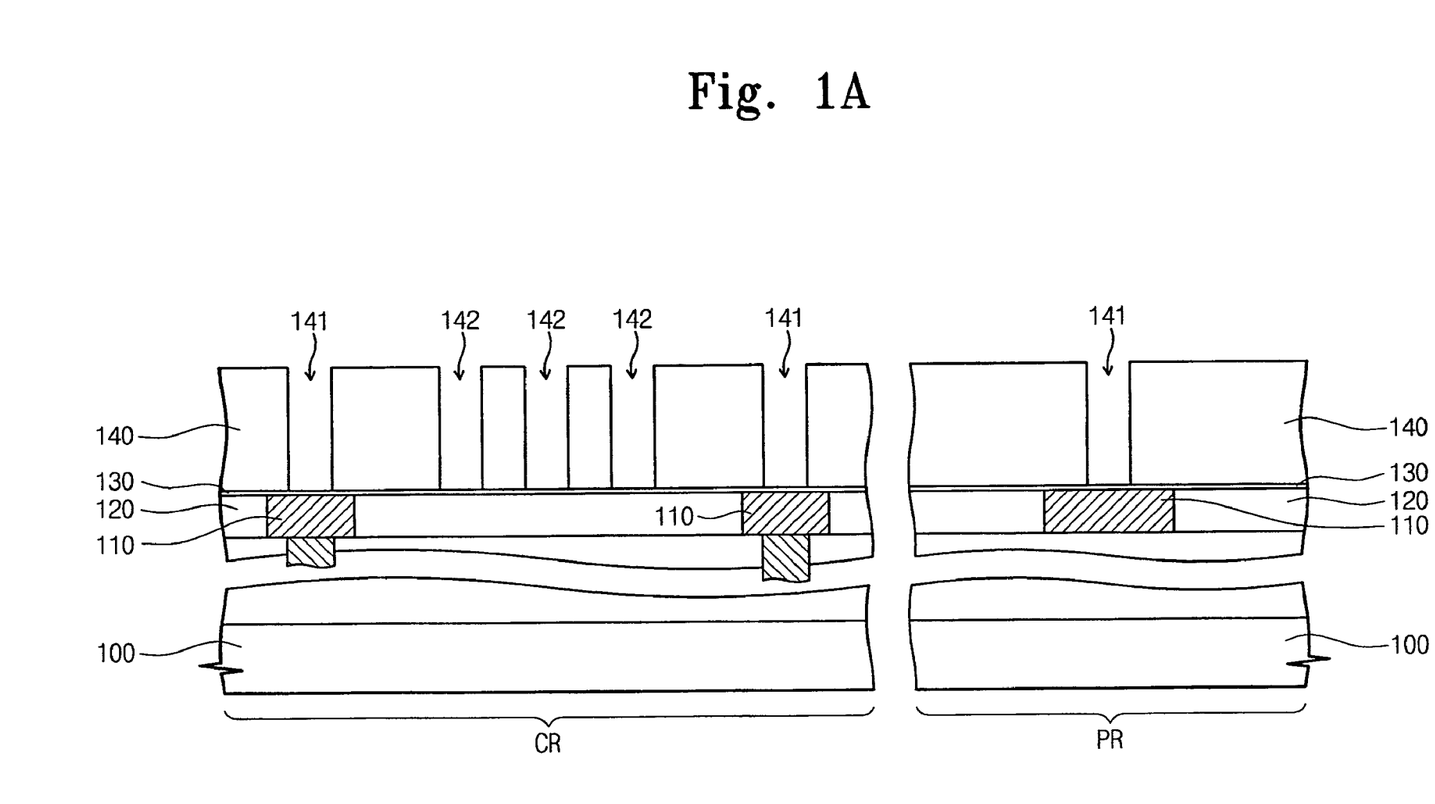
FIGS. 1A through 1F illustrate sectional view of stages of a method of fabricating a semiconductor device according to an embodiment of the present invention.

Referring to FIG. 1A, a lower structure may be formed on a semiconductor substrate 100 that may have a capacitor region CR and a pad region PR. The lower structure may include transistors formed on the semiconductor substrate 100, an interconnection structure connecting the transistors, and an insulation structure between the semiconductor substrate 100 and the transistors. The interconnection structure may provide structural support and electrical insulation. The interconnection structure may include interconnections 110. The insulation structure may also include a lower interlayer insulation layer 120. The illustrated interconnection 110 and the illustrated lower interlayer insulation layer 120 may correspond respectively to the highest structures among conductive materials and insulation materials constituting a lower structure.

An upper interlayer insulation layer 140 may be formed on the resulting structure having lower interlayer insulation layers 120 and the interconnections 110. The upper interlayer insulation layer 140 may be formed of at least one low-k dielectric layer which may include, e.g., a silicon oxide layer, a silicon nitride layer, a silicon oxide nitride layer, a spin-on-glass (SOG) layer, etc. An etch stop layer 130 having an etching selectivity with respect to the upper interlayer insulation layer 140 may be further formed below the upper interlayer insulation layer 140. That is, a first layer may have an etching selectivity with respect to a second layer such that the first layer may be etched with sufficiently slow etch rate during a predetermined etching process using an etching recipe for etching the second layer.

Next, the upper interlayer insulation layer 140 may be patterned to form via holes 141 exposing a portion of the interconnections 110 and mold openings 142 exposing a portion of the lower interlayer insulation layer 120. When the etch stop layer 130 is used, in order to prevent the etch damage on the interconnections 110 and the lower interlayer insulation layer 120, the via holes 141 and the mold openings 142 may be formed to expose a portion of the top surface of the etch stop layer 130. Here, the via holes 141 may expose the etch stop layer 130 on the interconnections 110 of the pad region PR, such that the interconnections 110 may be electrically connected with pads 180, which may be subsequently formed.

The mold openings 142 may be used as a mold to form a capacitor. The mold openings 142 may thus be formed on the capacitor region CR. An opposing area between capacitor electrodes increases due to the mold openings 142 such that the capacitor may have an increased capacitance. To maximize the opposing area, the mold openings 142 may vary in sectional structure and/or plane structure.

Figure 1B:
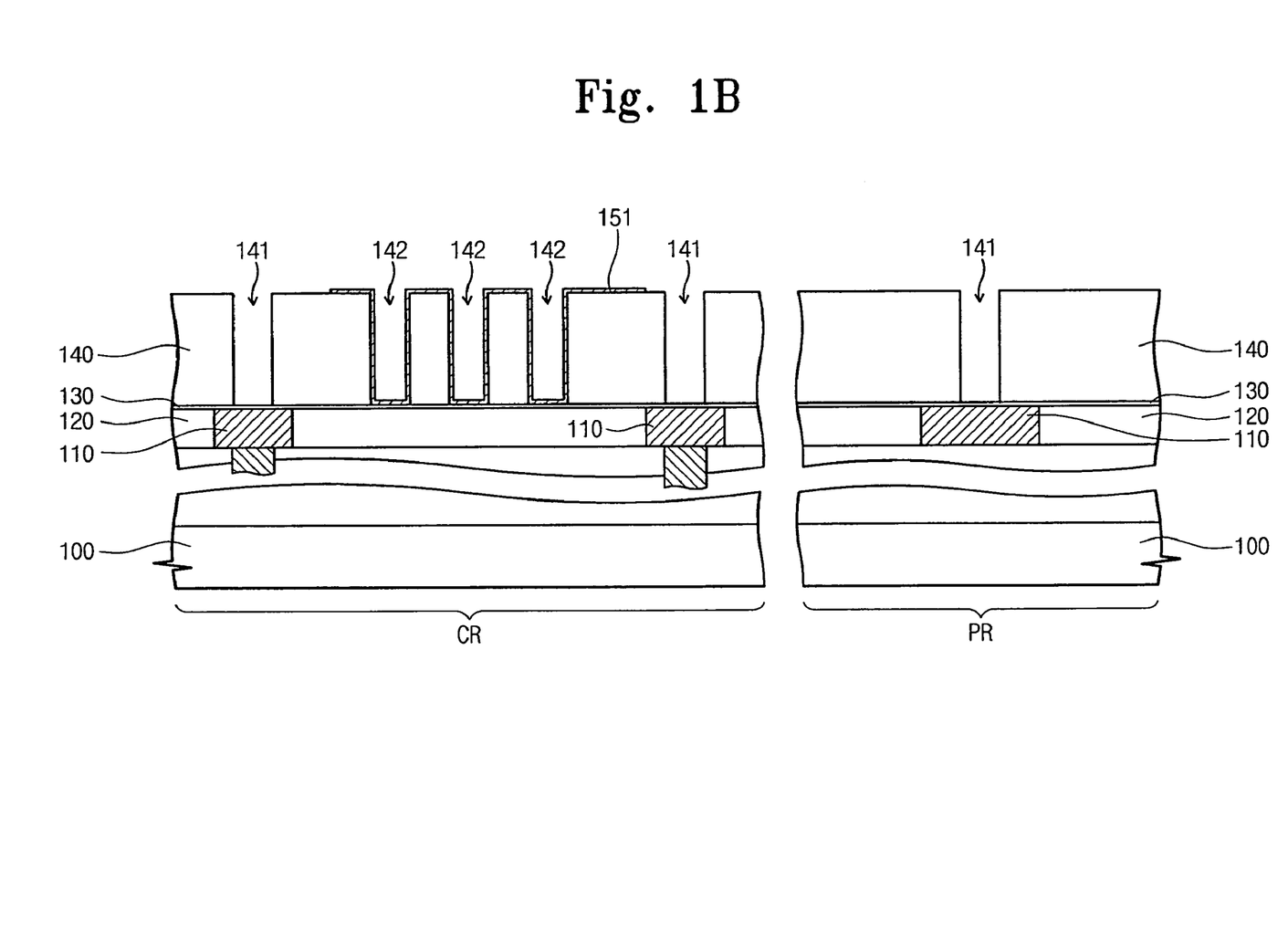

Referring to FIG. 1B, a bottom electrode layer may be formed to conform to the structure having the via holes 141 and the mold openings 142, and then the resulting structure may be patterned to form a bottom electrode 151 which may cover the inner wall of the mold openings 142 and the top surface of the upper interlayer insulation layer 140 around the inner wall of the mold openings 142. At this point, the bottom electrode 151 may be removed from the via hole 141 and the perimeter of the via hole 141 to expose the upper interlayer insulation layer 140. As a result, the bottom electrode 151 may be completely removed from the pad region PR, and the bottom electrode 151 may remain around the mold opening 142 of the capacitor region CR.

According to the present invention, to fabricate a metal-insulator-metal (MIM) capacitor, the bottom electrode layer may be formed of at least one metal material. For example, the bottom electrode layer may be at least one of, e.g., Ti, TiN, Ta, TaN, etc. Additionally, in order not to fill the mold opening 142, the bottom electrode layer may be deposited to be thinner than the width of the mold opening 142.

Figure 1C:
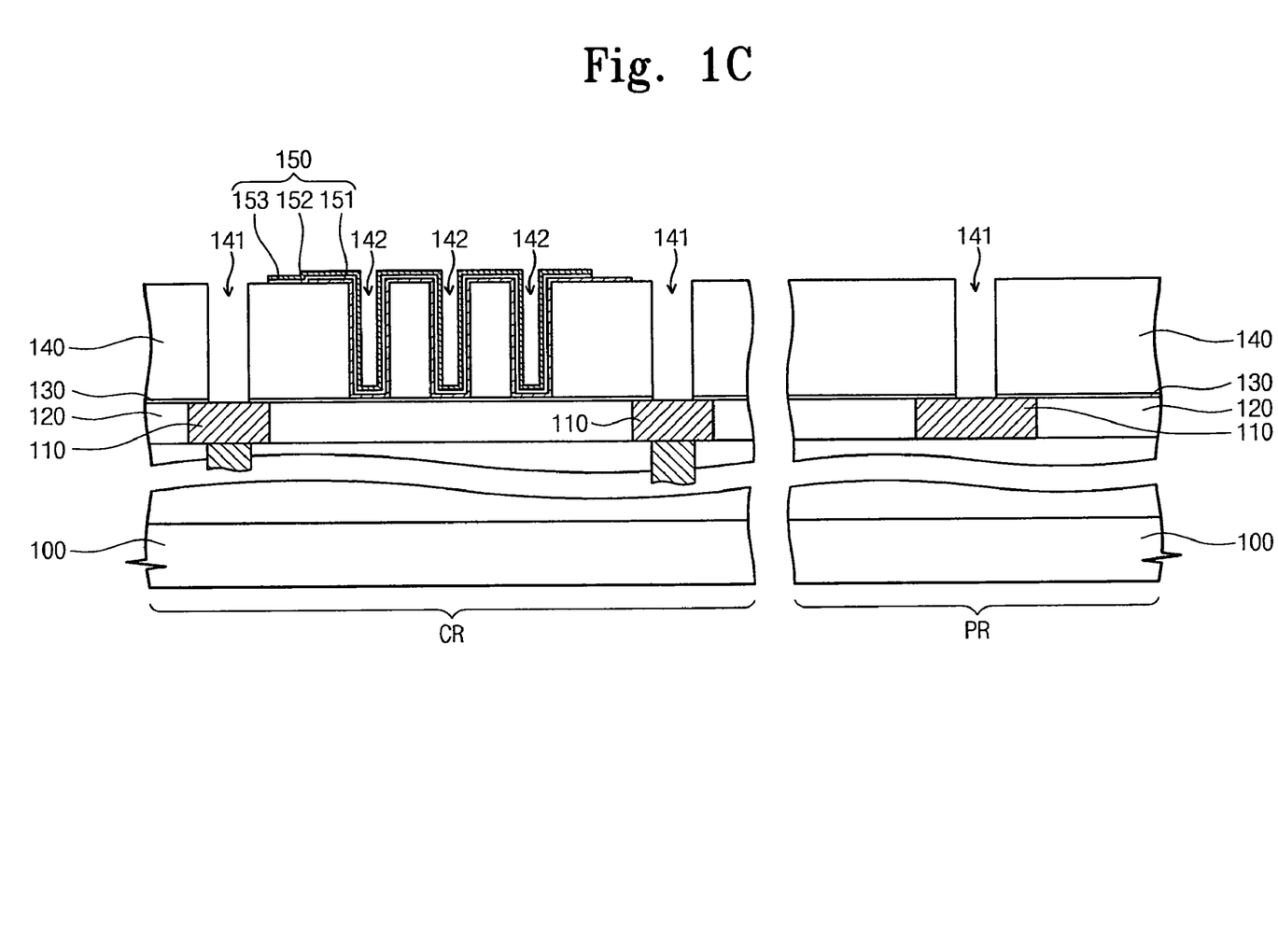

Referring to FIG. 1C, a dielectric layer and a top electrode layer may be sequentially formed on the structure having the bottom electrode 151. Then, the resulting structure may be patterned to form a dielectric layer pattern 152 and a top electrode 153 on the mold openings 142 and the perimeter of the mold openings 142 to form the capacitor 150. The dielectric layer pattern 152 and the top electrode 153 may be patterned using an identical mask pattern as an etching mask. The dielectric layer pattern 152 and the top electrode 153 may thus have a substantially identical structure in a plane arrangement. That is, the structural characteristics may be almost identical within a range of process error due to using the same process. The dielectric layer pattern 152 and the top electrode 153 may also be removed from the pad region PR.

Figure 1D:
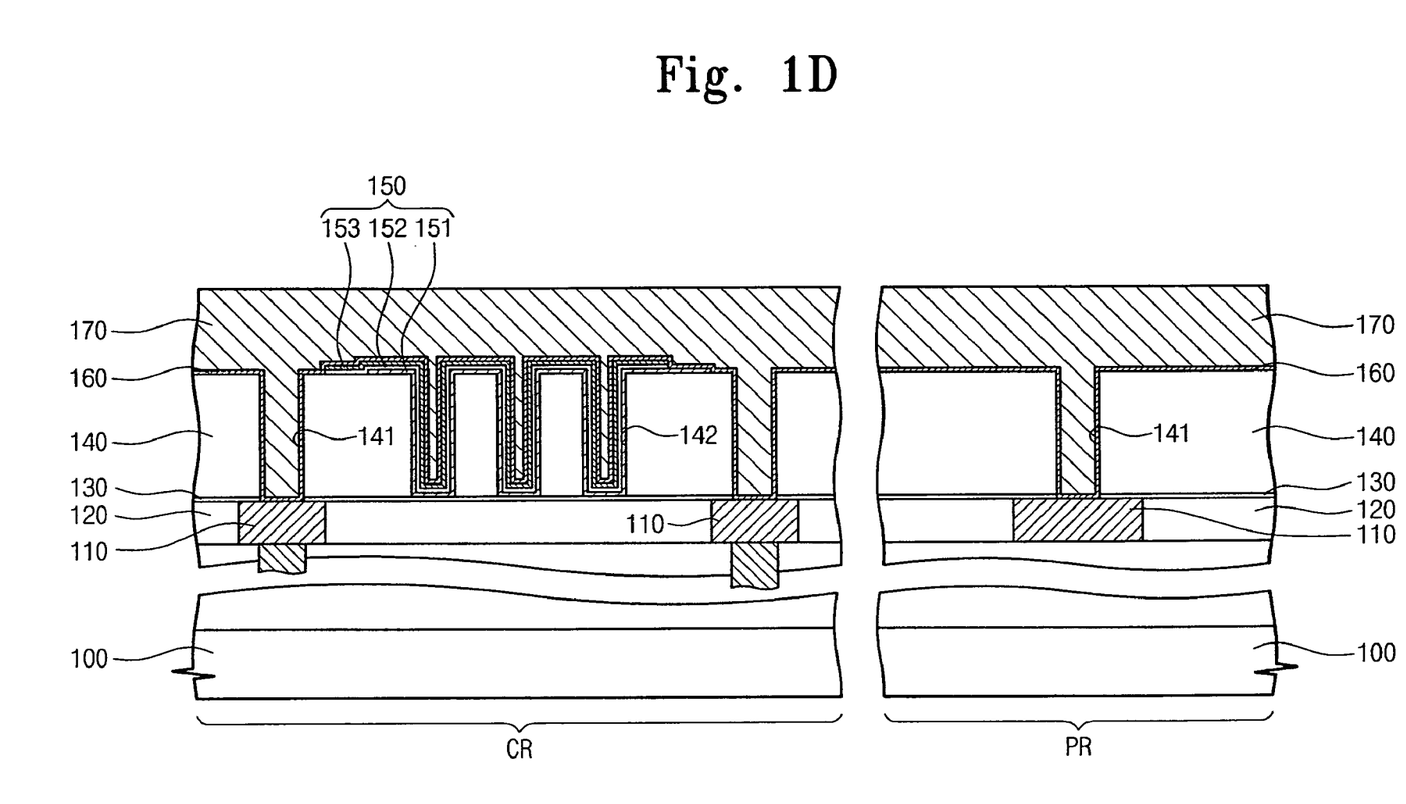
Figure 1E:
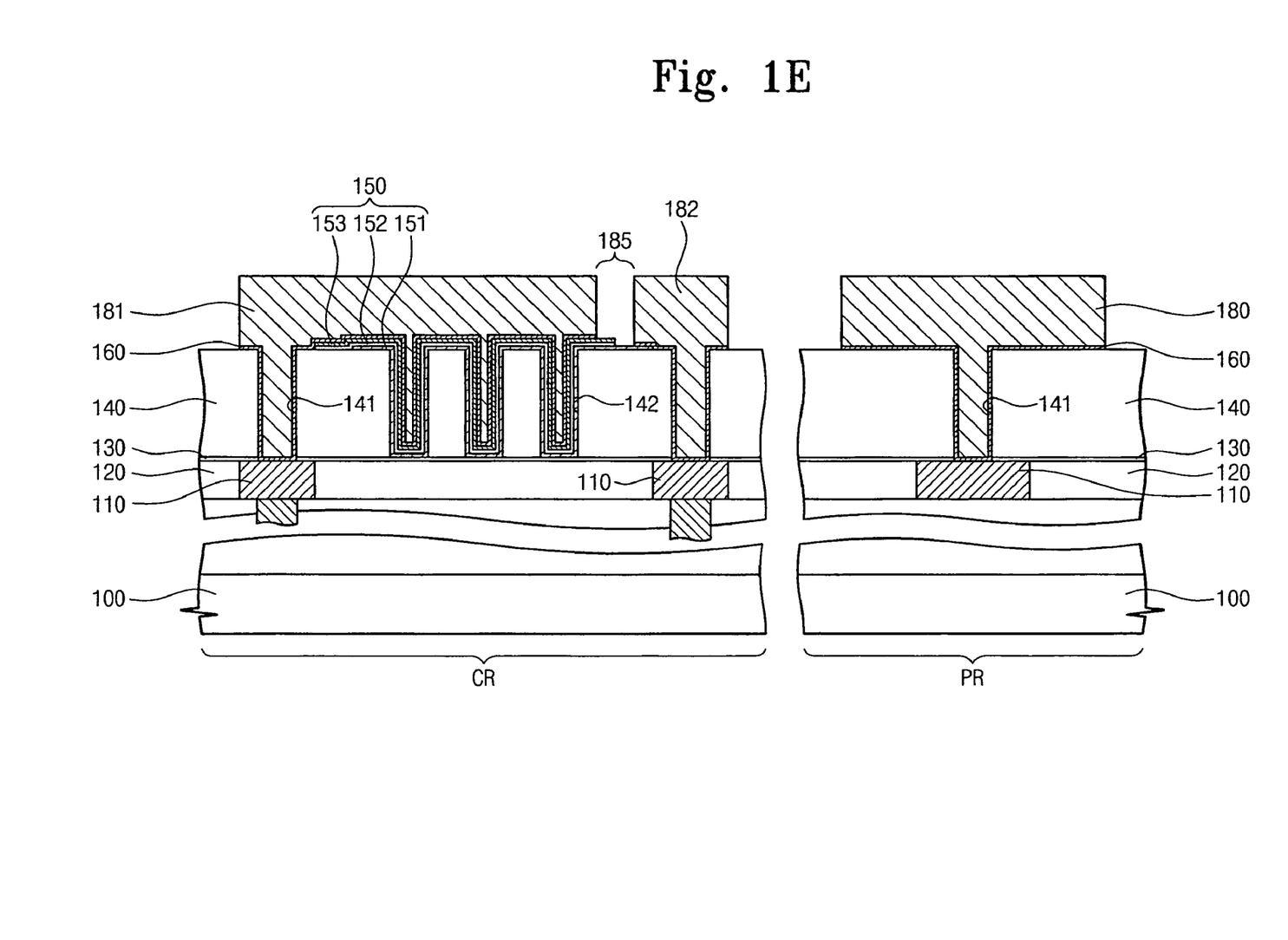
Figure 4:
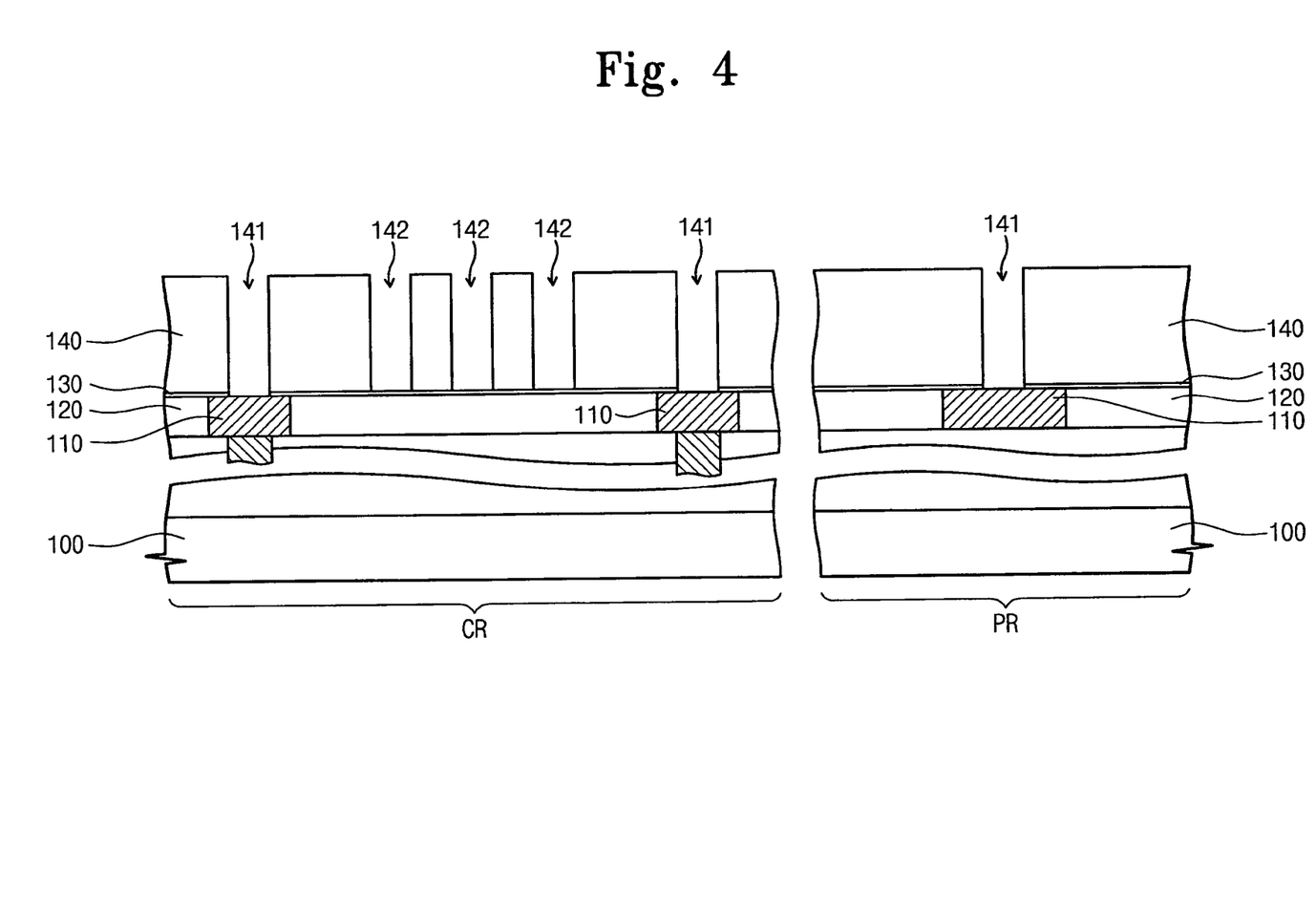
FIG. 4 illustrates a sectional view of a method of fabricating a capacitor structure of a semiconductor device according to a modified embodiment of the present invention.

The dielectric layer pattern 152 and the top electrode 153 may be formed to expose a portion of the bottom electrode 151 (which may be referred to as a connection region) to connect a second upper interconnection 182 and the bottom electrode 151, as illustrated in FIG. 1E. The top surface of the bottom electrode 151, except for the connection region, may be covered by the dielectric layer pattern 152 and the top electrode 153. To prevent an electrical short between the bottom electrode 151 and top electrode 153, the dielectric layer pattern 152 and the top electrode 153 may extend from the top surface of the bottom electrode 151 to cover a portion of the top surface of the upper interlayer insulation layer 140. Additionally, during this stage, the etch stop layer 130 exposed through the via holes 141 may be etched such that a portion of the interconnections 110 may be exposed. According to a modified embodiment of the present invention illustrated in FIG. 4, the etch stop layer 130 may be etched during an etching process for via hole formation.

The dielectric layer may be at least one high-k dielectric layer selected from, e.g., a silicon oxide layer, a silicon nitride layer, a silicon oxide nitride layer, a metallic material layer, a metal oxide layer, etc. The high-k dielectric layer may be one of, e.g., a tantalum oxide layer, a titanium oxide layer, a hafnium oxide layer, a zirconium oxide layer, an aluminum oxide layer, an yttrium oxide layer, a niobium oxide layer, a cesium oxide layer, an indium oxide layer, an iridium oxide layer, a barium strontium titanate (BST) layer, a lead zirconate titanate (PZT) layer, etc. Similar to the bottom electrode 151, to fabricate the MIM capacitor, the top electrode layer may be formed of at least one metallic material. The top electrode layer may be formed of at least one selected from, e.g., titanium (Ti), titanium nitride (TiN), tantalum (Ta), tantalum nitride (TaN), etc.

The bottom electrode 151, the dielectric layer pattern 152 and the top electrode 153 may constitute the capacitor 150 of the present invention. The capacitor structure of the present invention may further include upper interconnections electrically connected to the top electrode 153 and the bottom electrode 151 of the capacitor 150. The upper interconnections may be formed using a pad metal layer that may be the uppermost conductive film of the semiconductor device. A method of forming the upper interconnections using the pad metal layer will be described in more detail.

Referring to FIG. 1D, a pad metal layer 170 filling the via holes 141 may be formed on the surface of the structure having the capacitor 150. When considering the integrity of a next bonding process, the pad metal layer 170 may be formed of, e.g., aluminum, which may have excellent adhesion with respect to a gold wire. The pad metal layer may also be formed of copper. Besides gold, other materials may be used for the wire, e.g., copper, silver, aluminum, etc.

According to one embodiment of the present invention, before forming the pad metal layer 170, a barrier metal layer 160 may be formed to conform to and cover the structure having the capacitor 150. The barrier metal layer 160 may be formed of at least of, e.g., titanium (Ti), titanium nitride (TiN), tantalum (Ta), tantalum nitride (TaN), etc., which may be materials having an etching selectivity with respect to the top electrode 153 and the bottom electrode 151.

Referring to FIG. 1E, the pad metal layer 170 and the barrier metal layer 160 may be patterned to form a pad structure exposing the lower interlayer insulation layer 140. The pad structure may include pads 180 on the pad region PR to connect to interconnections 110 located below the pads 180 through the via hole 141, and first and second upper interconnections 181 and 182 on the capacitor region CR may connect to the top electrode 153 and the bottom electrode 151, respectively. Since the pads 180 and the first and second upper interconnections 181 and 182 may be formed by patterning identical thin layers, i.e., the pad metal layer 170 and the barrier metal layer 160, their thin layers may have substantially identical thickness, height, and material type.

The patterning of the pad structure formation may include etching the pad metal layer 170 using an etching solution that may have an etching selectivity with respect to the barrier metal layer 160, and etching the barrier metal layer 160 using an etching solution that may have an etching selectivity with respect to the top electrode 153 and the bottom electrode 151. For this, the barrier metal layer 160 may be formed of a material having an etching selectivity with respect to the top electrode 153 and the bottom electrode 151. The etching of the barrier metal layer 160 may use a time-based etching method for etching as a function of process time so as to etch any desired thickness of the barrier metal layer 160. In this etching stage, both wet and dry etching methods may be used.

A gap region 185 exposing a portion of the top electrode 153 and the bottom electrode 151 may be formed between the first and second upper interconnections 181 and 182. Portions of the sidewalls of the top electrode 153 and the dielectric layer pattern 152 may be exposed in the gap region 185. Due to the gap region 185, the first and second upper interconnections 181 and 182 may be electrically separated to connect the top electrode and bottom electrode 153 and 151, respectively.

Figure 1F:
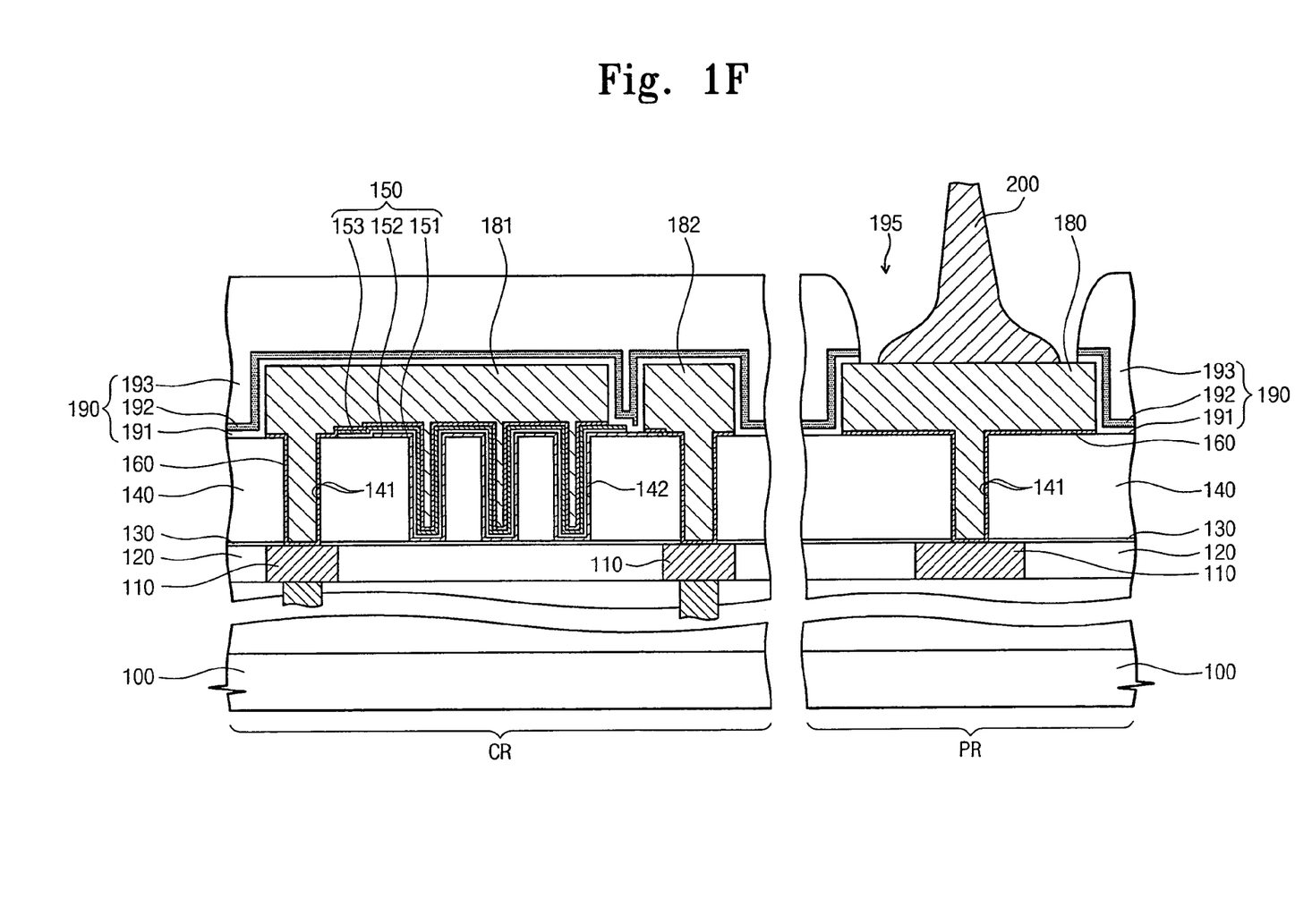

Referring to FIG. 1F, after forming a protective layer 190 on the structure having the pad structure, the resulting structure may be patterned to form pad openings 195 that may expose the top surfaces of the pads 180. At least one metal wire 200, e.g., a gold wire, may be connected to the top surfaces of the pads 180 exposed through the pad openings 195.

The protective layer 190 may include sequentially-stacked first to third protective layers 191, 192, and 193, which may include at least one polyimide layer. The first protective layer 191 may be, e.g., a silicon oxide layer, the second protective layer 192 may be, e.g., a silicon nitride layer, and the third protective layer 193 may be, e.g., a polyimide layer. However, the order of these protective layers may by different.

The pad openings 195 may be formed on the pad region PR. Additionally, balls for a ball grid array (BGA)-type package instead of the metal wire may be formed in the pad opening 195.

FIGS. 2A through 2E illustrate sectional views of a method of fabricating a semiconductor device according to an embodiment of the present invention. This embodiment may be identical to the previous embodiment except that the capacitor may be formed with a planar-type structure. Accordingly, technical features different from those of the embodiment will be mainly discussed for conciseness.

Figure 2A:
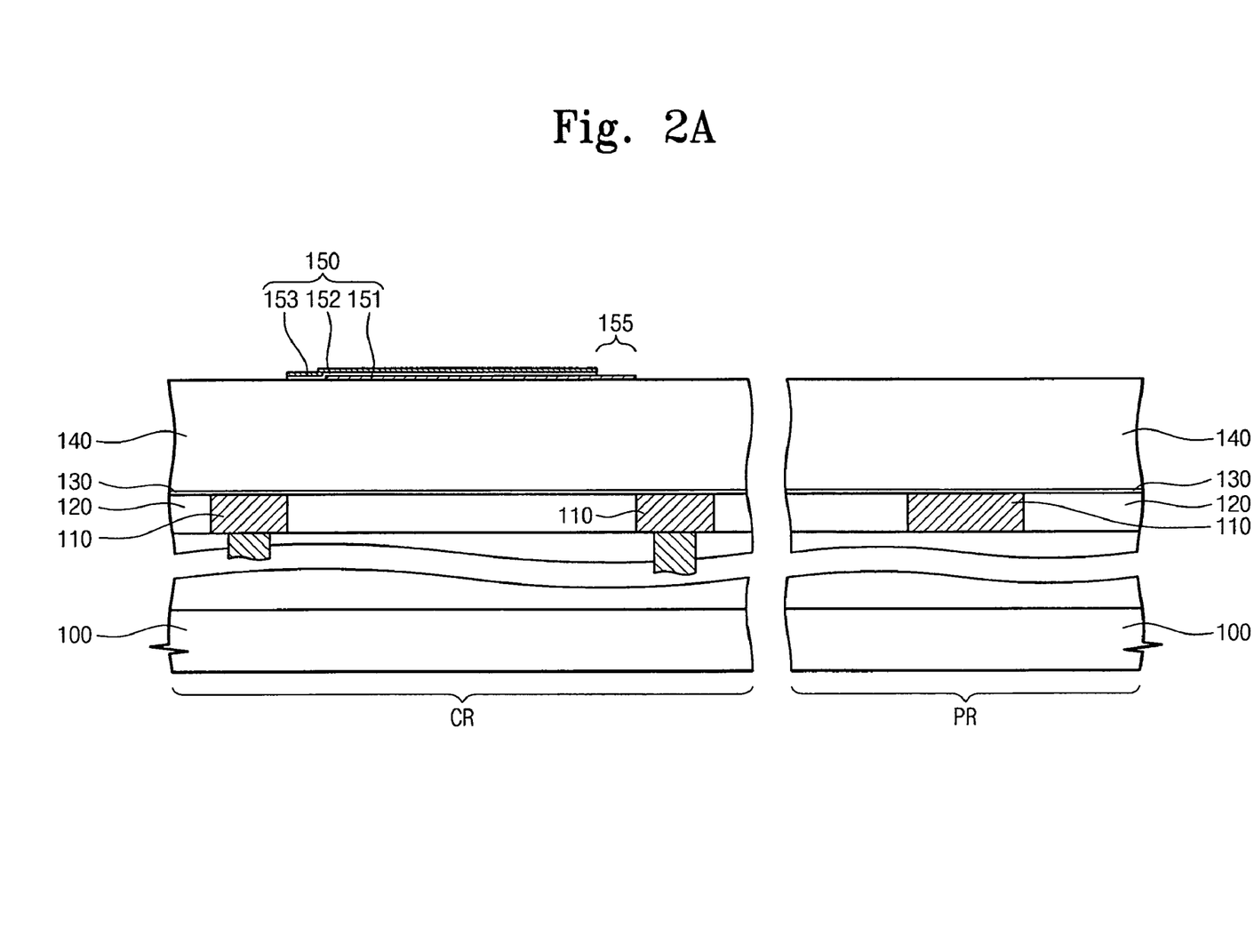
FIGS. 2A through 2E illustrate sectional views of stages of a method of fabricating a semiconductor device according to an embodiment of the present invention.
Figure 2B:
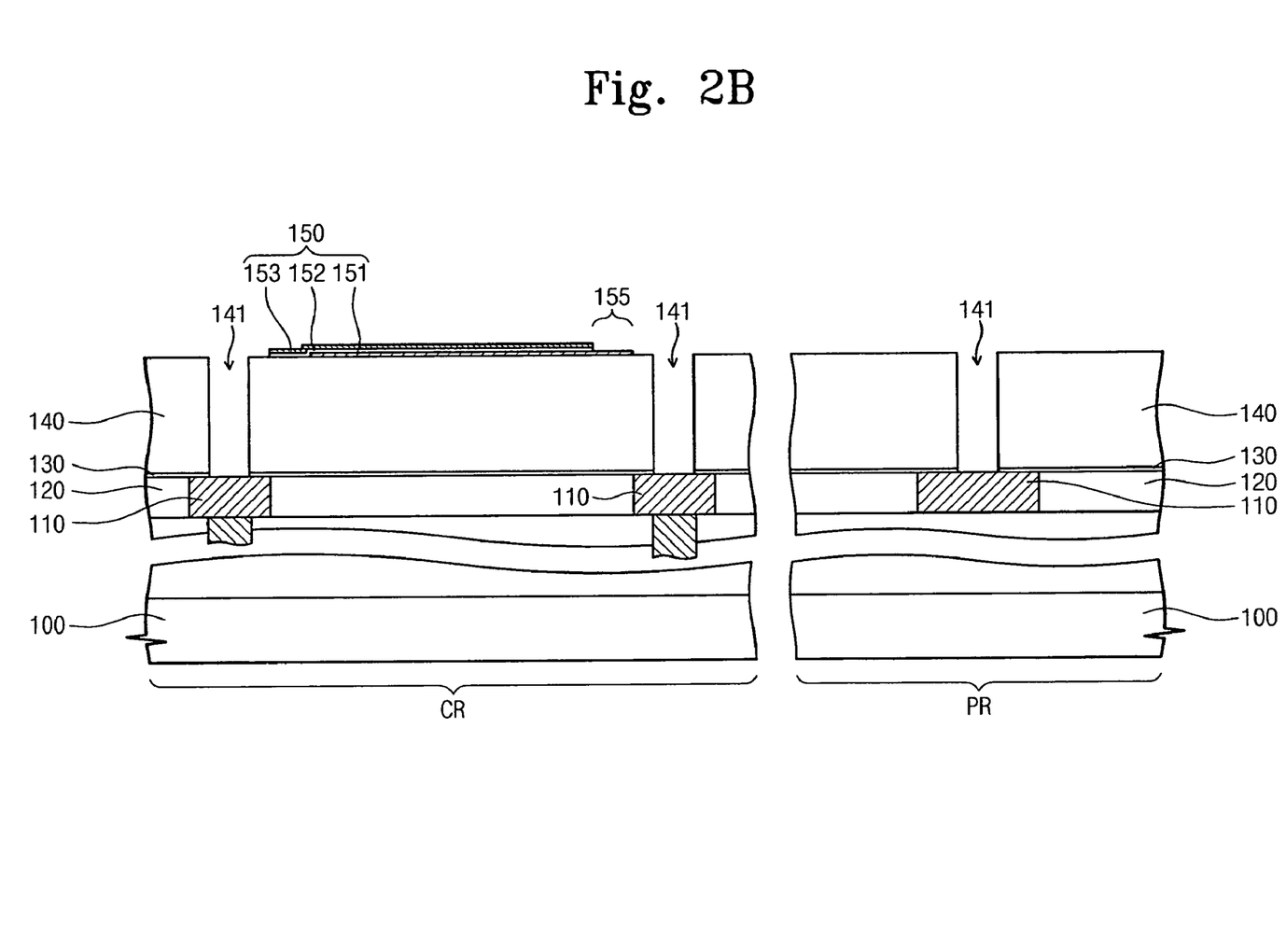

Referring to FIG. 2A, an etch stop layer 130 and an upper interlayer insulating layer 140 may be sequentially formed on the lower structure which may include a lower interlayer insulation layer 120 and an interconnection 110. Subsequently, a capacitor 150, which may include a bottom electrode 151, a dielectric pattern 152 and top electrode 153, may be formed on the upper interlayer insulating layer 140. Similar to the aforementioned embodiment, the upper interlayer insulating layer 140 may be directly formed on the lower structure without the etch stop layer 130.

Forming the capacitor 150 may include forming a bottom electrode layer on an upper interlayer insulation layer 140, and patterning the resulting structure to form a bottom electrode 151 on the capacitor region CR. The mold openings 142 may not be formed in this embodiment of the present invention, and the bottom electrode 151 may be formed on the upper interlayer insulation layer in a plate shape. The forming of the dielectric layer pattern 152 and the top electrode 153 may include forming a dielectric layer and a top electrode layer on the structure having the bottom electrode 151, and patterning the resulting structure by using a single mask.

To connect the bottom electrode 151 and a second upper interconnection 182, the dielectric layer pattern 152 and the top electrode 153 may be formed to expose a portion of the bottom electrode 151. The entire top surface of the bottom electrode 151 except for a connection region 155 may be covered by the dielectric layer pattern 152 and the top electrode 153. In order to prevent a short between the bottom electrode 151 and the top electrode 153, the dielectric layer pattern 152 and the top electrode 153 may extend from the top surface of the bottom electrode 151 to cover a portion of the lower interlayer insulation layer 140. The capacitor 150 may be removed from the top surface of the interconnections 110 such that a portion of the upper interlayer insulation layer 140 may be exposed.

Referring to FIGS. 2B through 2E, the upper interlayer insulation layer 140 and the etch stop layer 130 may be patterned to form via holes 141 exposing the top surface of the interconnections 110. In this embodiment of the present invention, the via holes 141 may be formed after the capacitor 150 is formed.

Figure 2C:
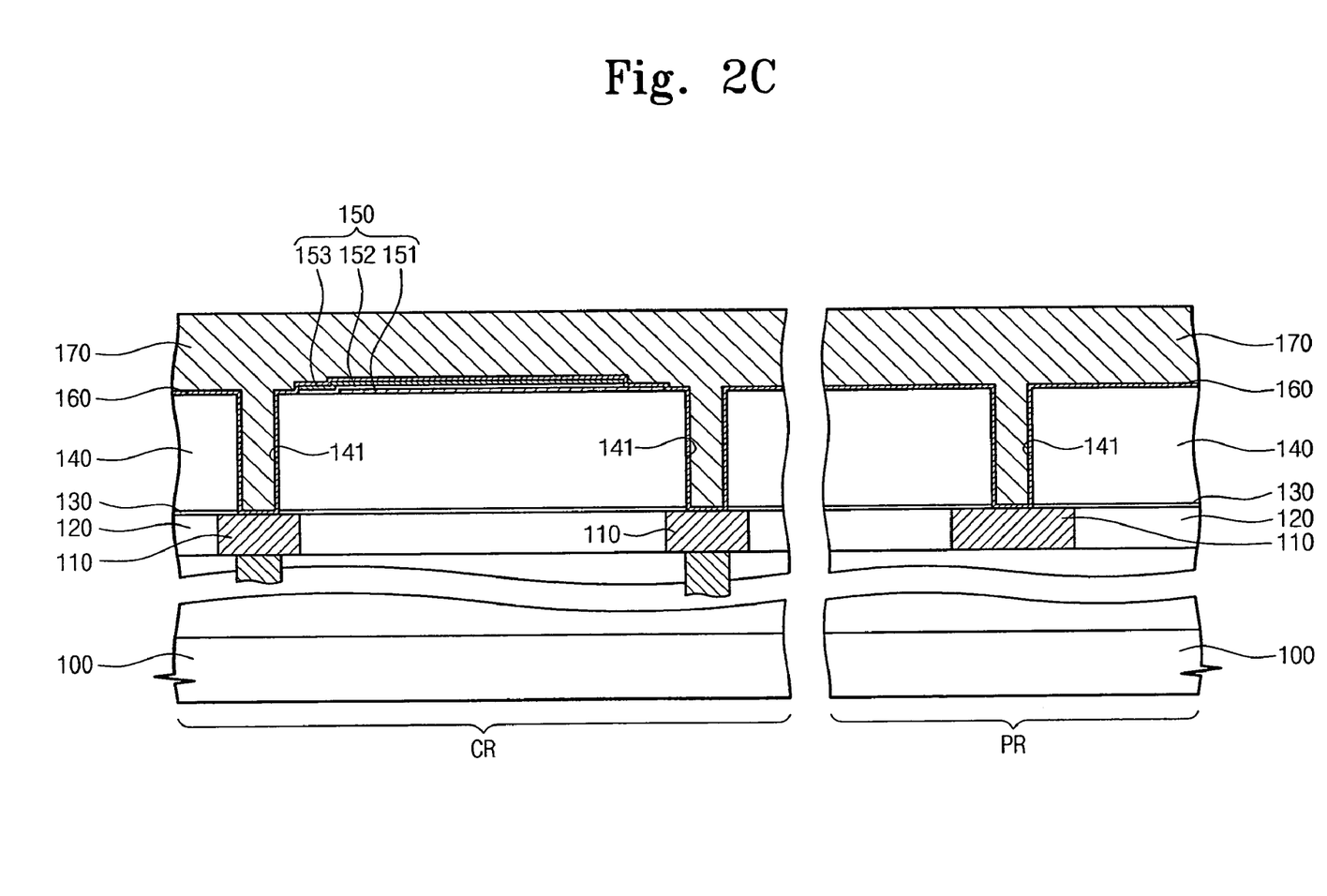
Figure 2D:
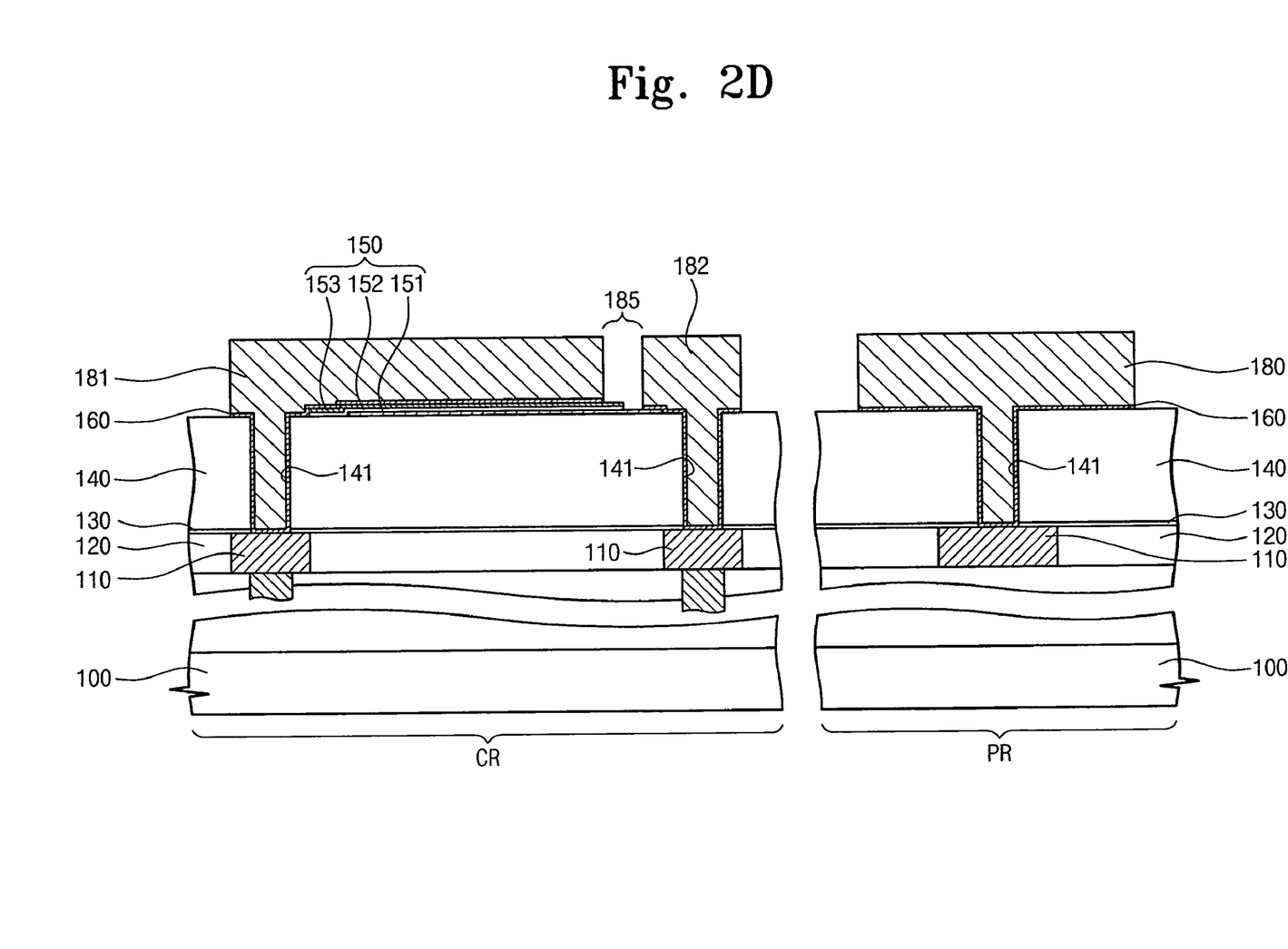
Figure 2E:
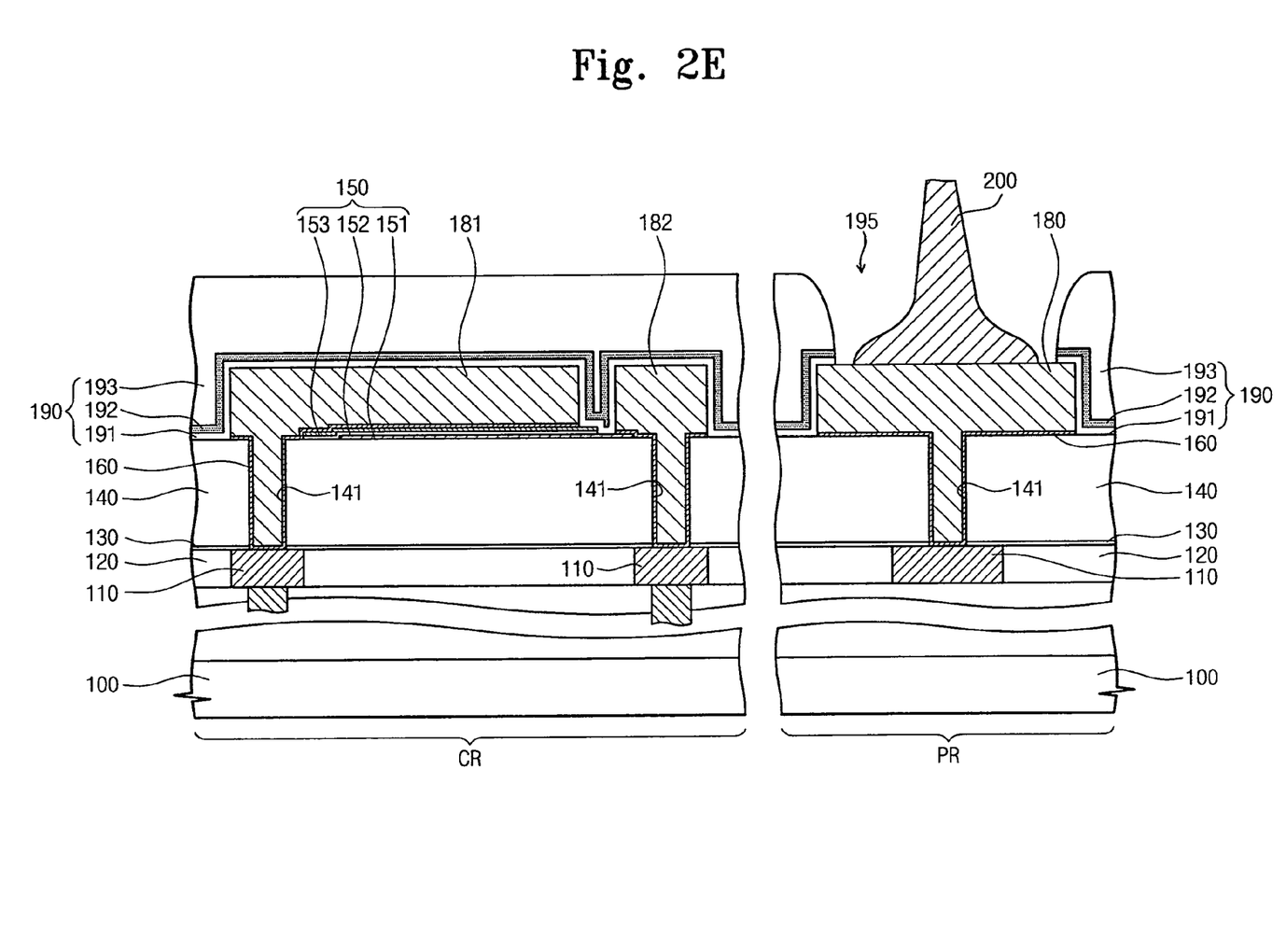

A barrier metal layer 160 and a pad metal layer 170 filling the via holes 141 to cover the capacitor 150 may be sequentially formed (see FIG. 2C). The resulting structure may be patterned to form a pad structure exposing the upper interlayer insulation layer 140 (see FIG. 2D). The pad structure may include a pad 180 on the pad region PR to connect to the interconnection 110 below the pad 180 through the via hole 141. First and second upper interconnections 181 and 182 may be formed on the capacitor region CR to connect to the top electrode 153 and the bottom electrode 151, respectively. A gap region 185 exposing a portion of the top electrode 153 and the bottom electrode 151 may be formed between the first and second upper interconnections 181 and 182. Next, a protective layer 190 having the pad opening 195 may be formed, as illustrated in FIG. 2E.

Figure 3:
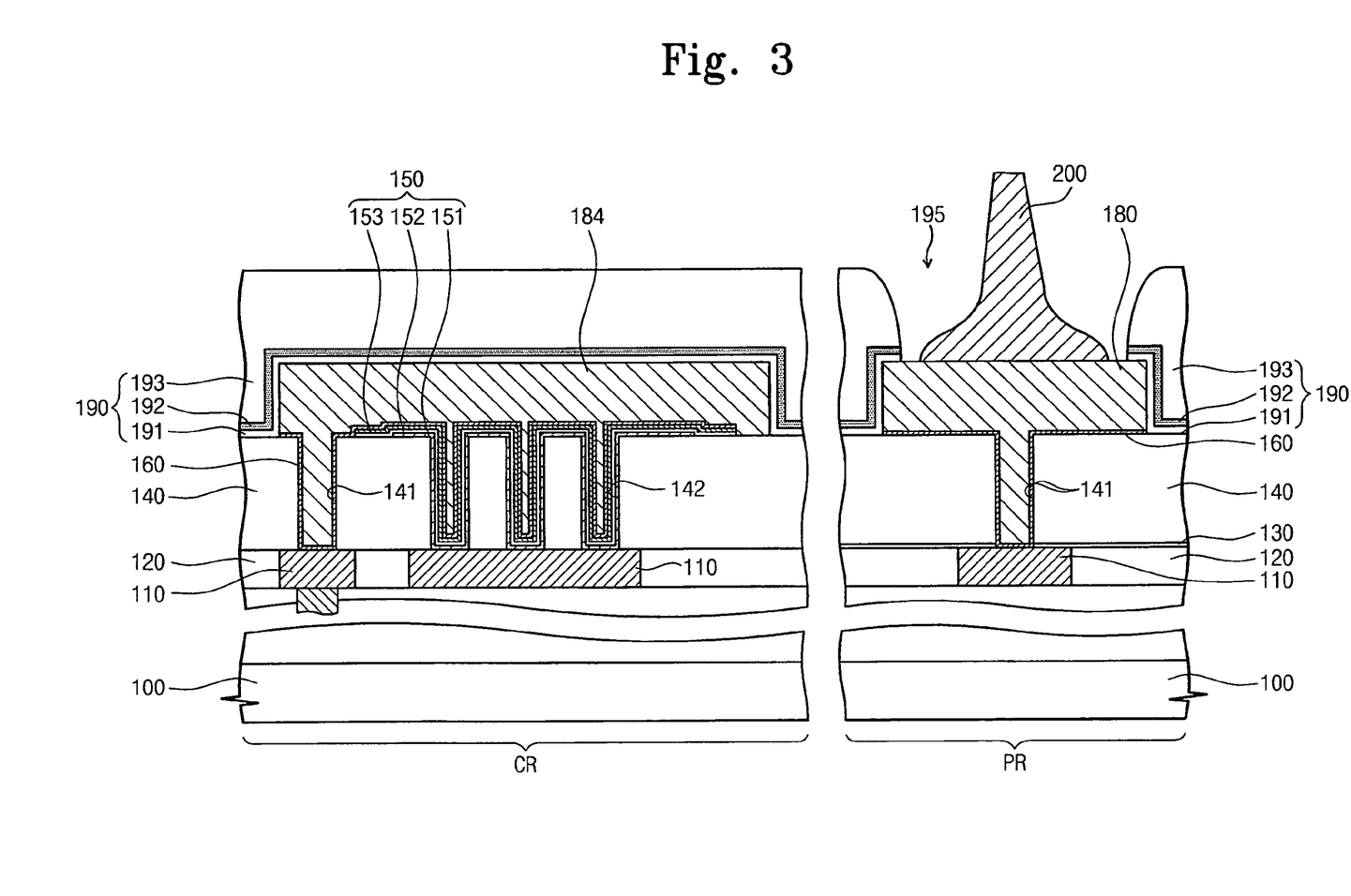
FIG. 3 illustrates a sectional view of a method of fabricating a capacitor structure of a semiconductor device according to an embodiment of the present invention.

FIG. 3 illustrates a sectional view of a method of fabricating a capacitor structure of a semiconductor device according to a third embodiment of the present invention.

Referring to FIG. 3, a bottom electrode 151 of a capacitor 150 may directly contact the top surface of interconnections 110. A top electrode 153 may be completely covered by an upper interconnection 184 constituting the pad structure. A capacitor structure may be readily manufactured by modifying the embodiment of FIGS. 1A through 1F. For example, mold openings 142 may be formed to expose one of the interconnections 110. According to this embodiment of the present invention, since the bottom electrode 151 may directly contact the interconnection 110, the second upper interconnection 182 connecting the interconnection 110 and the bottom electrode 151 in the previous embodiment of the present invention may be unnecessary. Additionally, since the pad structure may not expose the capacitor 150, considerations regarding the etching selectivity between the top electrode 153 or the bottom electrode 151 and the barrier metal layer 160 may be unnecessary during the patterning of the pad structure formation.

Furthermore, the interconnection 110 connected to the bottom electrode 151 may be formed below the capacitor 150, and may be formed in an area corresponding to that of the capacitor 150. In this case, the interconnection 110 may be used as a shielding structure that may prevent electromagnetic noise, which may be generated from the semiconductor substrate 100, from being transferred into the capacitor 150.

Since the capacitor of the present invention may be electrically connected by using a metal layer for a pad, the capacitor may be spaced farthest from the semiconductor substrate. Accordingly, the influence of any substrate noise may be minimized. Therefore, the stable characteristic in the capacitor storage capacity may be achieved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a capacitor structure of a semiconductor device, comprising:
    forming an interlayer insulation layer on a semiconductor substrate;
    forming a capacitor on the interlayer insulation layer, the capacitor including a bottom
    electrode, a dielectric layer pattern, and a top electrode,
    forming a pad metal layer on the interlayer insulation layer to cover the capacitor; and
    patterning the pad metal layer to form pads for bonding with external electronic devices and to form first and second upper interconnections connected to the top electrode and the bottom electrode, respectively,
    wherein the dielectric layer pattern and the top electrode are formed to expose a portion of a top surface of the bottom electrode.

2. The method as claimed in claim 1, wherein forming the capacitor comprises:
    forming a bottom electrode layer on the interlayer insulation layer;
    patterning the bottom electrode layer to form the bottom electrode;
    sequentially forming a dielectric layer and a top electrode layer on the resulting structure having the bottom electrode; and
    patterning the dielectric layer and the top electrode layer to form the dielectric layer pattern and the top electrode which are sequentially stacked.

3. The method as claimed in claim 2, wherein the dielectric layer pattern and the top electrode are formed to extend from a top surface of the bottom electrode to cover a top surface of the interlayer insulation layer in a region adjacent to the first upper interconnection, and the dielectric layer pattern and the top electrode are patterned to expose the top surface of the bottom electrode in a region adjacent to the second upper interconnection; and the second upper interconnection is connected to the top surface of the exposed bottom electrode.

4. The method as claimed in claim 1, further comprising:
    before the forming of the interlayer insulation layer, forming interconnections on the semiconductor substrate;
    after the forming of the pads and the first and second upper interconnections, forming a protective layer pattern on the pads and the first and second upper interconnections, the protective layer pattern having openings exposing top surfaces of the pads; and
    bonding metal wires to the top surfaces of the pads exposed through the openings.

5. The method as claimed in claim 1, wherein height, thickness and material of the first and second upper interconnections are substantially identical to those of the pads.

6. The method as claimed in claim 4, wherein the top surfaces of the pads and the bottom electrode of the capacitor are formed to be electrically connected to the interconnections through the first and second upper interconnections, which are connected to top surfaces of the top and bottom electrodes, respectively.

7. The method as claimed in claim 4, wherein the protective layer pattern is formed of at least one of a silicon oxide layer, a silicon nitride layer, or a polyimide layer, and includes at least one polyimide layer.

8. The method as claimed in claim 4, further comprising:
    before the forming of the capacitor, patterning the interlayer insulation layer to form vias and at least one mold opening, the vias penetrating the interlayer insulation layer to expose top surfaces of the interconnections, the mold opening penetrating the interlayer insulation layer,
    wherein the mold opening is formed on a region where the capacitor is formed, and the pad metal layer is connected to the interconnections through the vias.

9. The method as claimed in claim 8, wherein:
    the bottom electrode, the dielectric layer pattern, and the top electrode are formed to expose the vias and a top surface of the interlayer insulation layer around the vias, and the bottom electrode, the dielectric layer pattern, and the top electrode conform to and cover the mold opening.

10. The method as claimed in claim 4, further comprising:
    after the forming of the capacitor, patterning the interlayer insulation layer to form vias exposing the top surfaces of the interconnections,
    wherein the pad metal layer is connected to the interconnections through the vias.

11. The method as claimed in claim 8, wherein patterning the metal layer comprises:
    forming the first upper interconnection and the second upper interconnection such that the first upper interconnection covers a top surface of the top electrode of the capacitor, and the first upper interconnection is connected to one of the interconnections through at least one of the vias, and the second upper interconnection is connected to a top surface of the bottom electrode of the capacitor and to another one of the interconnections through at least one of the vias.

12. The method as claimed in claim 1, further comprising:
    locating the pad and the first and second upper interconnections to be spaced farthest from the semiconductor substrate among conductive structures constituting the semiconductor device; and
    locating the capacitor to be spaced farthest from the semiconductor substrate among conductive structure constituting the semiconductor device except for the pad and the first and second upper interconnections.

13. A semiconductor device, comprising:
interconnections on a semiconductor substrate;
an interlayer insulation layer on the interconnections, the interlayer insulation layer having vias exposing a portion of a top surface of the interconnections;
a capacitor on the interlayer insulation layer, the capacitor having a bottom electrode, a dielectric layer pattern, and a top electrode; and
a pad structure connected to the interconnections through the vias, wherein:
the pad structure includes pads for bonding with external electronic devices, a first upper interconnection connected to the top electrode of the capacitor, and a second upper interconnection spaced apart from the first upper interconnection and connected to a top surface of the bottom electrode of the capacitor, and
the dielectric layer pattern and the top electrode expose the top surface of the bottom electrode in a region adjacent to the second upper interconnection.

14. The semiconductor device as claimed in claim 13, further comprising:
a protective layer pattern on the pad structure and having openings selectively exposing the top surfaces of the pads,
wherein the protective layer pattern includes at least one polyimide layer.

15. The semiconductor device as claimed in claim 13, wherein the pad structure is a conductive structure farthest from the semiconductor substrate among conductive structures constituting the semiconductor device; and
the capacitor is a conductive structure that is farthest from the semiconductor substrate among conductive structures constituting the semiconductor device except for the pad structure.

16. A semiconductor device, comprising:
interconnections on a semiconductor substrate;
an interlayer insulation layer on the interconnections, the interlayer insulation layer having vias and a mold opening exposing a portion of a top surface of the interconnections;
a capacitor on the interlayer insulation layer, the capacitor having a bottom electrode, a dielectric layer pattern, and a top electrode; and
a pad structure connected to the interconnections through the vias, wherein:
the pad structure includes pads for bonding with external electronic devices, a first upper interconnection connected to the top electrode of the capacitor, and wherein the bottom electrode of the capacitor is connected to the interconnection exposed by the mold opening.

* * * * *